United States Patent [19]

Nordholt et al.

[11] Patent Number: 4,608,544
[45] Date of Patent: Aug. 26, 1986

[54] OSCILLATOR CIRCUIT

[75] Inventors: Ernst H. Nordholt, Berkel en Rodenrijs; Cornelis A. M. Boon, Eindhoven, both of Netherlands

[73] Assignee: U.S. Philips Corporation, New York, N.Y.

[21] Appl. No.: 675,110

[22] Filed: Nov. 27, 1984

[30] Foreign Application Priority Data

Nov. 29, 1983 [NL] Netherlands .......................... 8304085

[51] Int. Cl.$^4$ ............................................. H03L 5/00
[52] U.S. Cl. ................................ 331/109; 331/117 R; 331/183
[58] Field of Search ............. 331/109, 117 R, 117 FE, 331/183

[56] References Cited

U.S. PATENT DOCUMENTS 3,649,929 3/1972 Thompson ...................... 331/109 X
3,665,342 5/1972 Reed ........................... 331/117 R X

FOREIGN PATENT DOCUMENTS 2803430 8/1979 Fed. Rep. of Germany ... 331/117 R
0148462 11/1979 Japan ............................. 331/117 R Primary Examiner—Eugene R. LaRoche
Assistant Examiner—Robert J. Pascal
Attorney, Agent, or Firm—Thomas A. Briody; William J. Streeter; Marianne R. Rich

[57] ABSTRACT

Oscillator circuit has a first and second transistors whose emitters are intercoupled and jointly connected to a variable current source, the first transistor being connected in a grounded-base connection. The oscillator current also has a parallel resonant circuit coupled to the collector of the first transistor, this collector being coupled for regenerative feedback of the circuit voltage to the base of the second transistor. Stabilization of the circuit voltage is accomplished by coupling the last-mentioned collector also to a control input of a variable current source, so that the collector current applied to the circuit is modulated in anti-phase with the circuit voltage, that is to say it instantaneously decreases at an increase of the circuit voltage and vice versa.

3 Claims, 8 Drawing Figures

OSCILLATOR CIRCUIT

BACKGROUND OF THE INVENTION

1. Field of the Invention

The invention relates to an oscillator circuit comprising first and second transistors, whose emitters are intercoupled and jointly connected to a variable current source, the first transistor being connected in grounded-base connection, also comprising a parallel resonant circuit coupled to the collector of the first transistor, the collector being coupled to the base of the second transistor for a regenerative feedback of the circuit voltage.

2. Description of the Prior Art

Such an oscillator circuit is described in the published Netherlands Patent Application No. 147294.

When the prior art oscillator circuits are produced in larger quantities, the individual circuits may mutually show spread in the amplitude of the oscillator output signal, for example due to inaccuracies in the values of the circuit elements. In addition, the oscillator amplitude may vary due to inter alia temperature fluctuations or ageing.

The influence of such factors on the oscillator amplitude can be reduced by amplitude detection of the oscillator signal and by negative feedback of the d.c. voltage signal thus obtained to the variable current source. Such an automatic gain control (AGC) for the IF-signal in AM-receivers is known from, for example, the U.S. Pat. No. 3,284,713 and is not so suitable for integration because of the comparatively large capacitance required for amplitude detection. In addition the amplitude detection when used in an oscillator circuit introduces a certain degree of control inertia, which may result in unwanted transients.

The invention has for its object to provide an oscillator circuit comprising a simple stabilizing circuit, which can be easily integrated and stabilizes the oscillator amplitude at a predetermined value without any noticeable delay and highly independent of the spread in values of the circuit elements.

According to the invention, an oscillator circuit of the type described in the opening paragraph is characterized in that said collector is also coupled to a control input of the variable current source for an instantaneous variation of the current of the variable current source in dependence on the circuit voltage.

The invention is based on the recognition that stabilizing the oscillator amplitude is possible without amplitude detection by an instantaneous, negative feedback of the circuit voltage.

Such an instantaneous negative feedback is realized by applying the measure according to the invention. Then an increase or decrease, respectively of the emitter current produced by the variable current source instantaneously coincides with a decrease or increase, respectively in the conduction of the first transistor. If the oscillator amplitude or circuit voltage variation increases, for example as a result of the above-mentioned ambient factors, then also the emitter current variations increases, which for a suitably chosen transistor setting results in an instantaneous decrease of the collector current of the first transistor applied to the resonant circuit. The reverse holds for the case in which the oscillator amplitude decreases.

Although the collector current of the second transistor varies in the same phase as the oscillator signal this does not have any effect on the circuit voltage as the second transistor only functions as an emitter follower and its collector current flows to ground without passing through the resonant circuit.

A preferred embodiment of the oscillator circuit according to the invention is characterized in that the variable current source comprises a third transistor, whose collector is connected to the intercoupled emitters of the two first and second transistors and that the collector of the first transistor is coupled via an emitter follower to a first voltage divider, a first output of which is connected to the base of the second transistor and a second output to the base of the third transistor.

When this measure is applied, an adequate setting of on the one hand a sufficiently strong positive feedback to maintain an oscillation and on the other hand a sufficiently strong negative feedback for an acceptable stabilization of the oscillator amplitude can be obtained in a simple way.

A further preferred embodiment of such an oscillator circuit is characterized in that the current source comprises a fourth transistor, whose base is connected to a fixed base-biassing voltage and whose emitter is coupled to the emitter of the third transistor, both emitters being jointly connected to a constant current source, the current thereof at the biassing voltage of the third and fourth transistors flowing to a sufficient extent through the third transistor for amplifying the circuit voltage in the first transistor, such that regeneration of the circuit voltage occurs.

When this measure is applied, the emitter currents of the first and second transistors vary more than linear, with the circuit voltage which is fed back to the base of the third transistor, as a result of which the influence of the circuit quality on the amplitude of the circuit voltage decreases still further.

A simple base voltage bias of the first and fourth transistors is obtained in a still further preferred embodiment, in which a second voltage divider is arranged between a supply voltage and ground, a first output thereof being coupled to the base of the first transistor and a second output to the base of the fourth transistor.

The invention will now be described in greater detail by way of example with reference to the Figures in the accompanying drawing.

DESCRIPTION OF THE PREFERRED EMBODIMENTS

Figure 1:
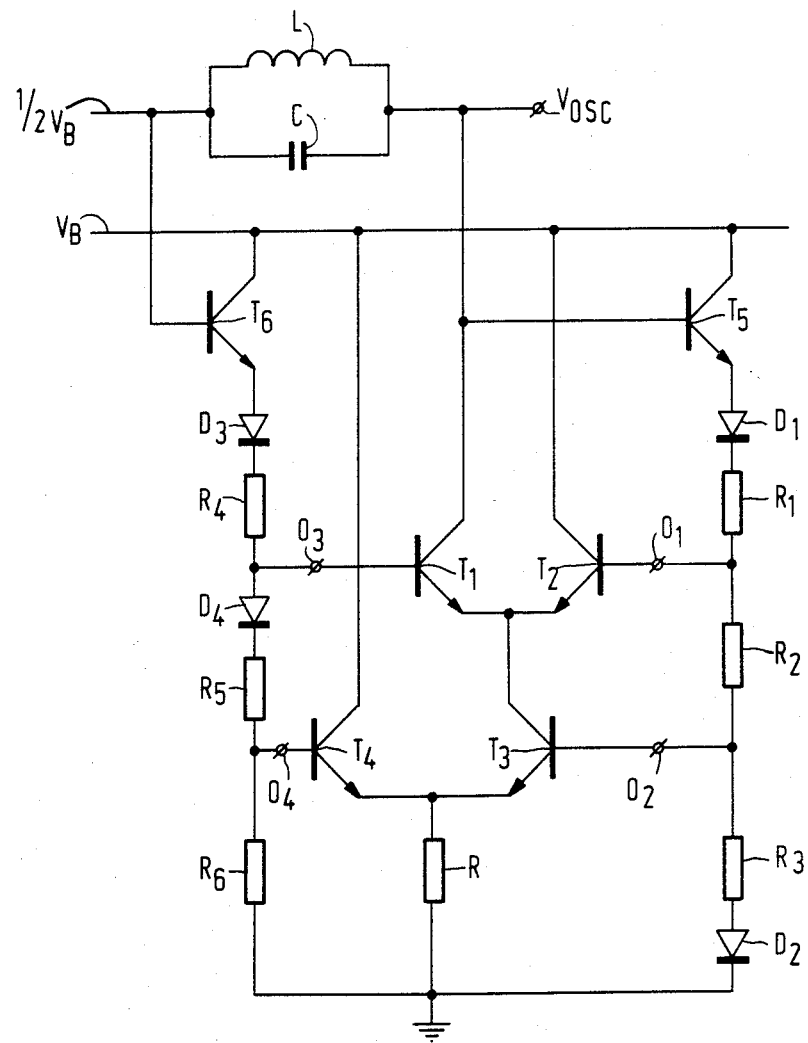
FIG. 1 shows an oscillator circuit according to the invention.

FIG. 1 shows an oscillator circuit according to the invention comprising first and second emitter-coupled transistors $T_1$ and $T_2$, respectively with a variable current source $T_3$, $T_4$, R included in a common emitter path. The current source $T_3$, $T_4$, R comprises third and fourth emitter-coupled transistors $T_3$ and $T_4$, respectively with a high ohmic resistor R included in a common emitter path and acting as a constant-current source. The collector of the third transistor $T_3$ is connected to the coupled emitters of the first and second transistors $T_1$ and $T_2$. The base of this third transistor $T_3$ constitutes a control input of the variable current source $T_3$, $T_4$, R.

The base biasing voltages of said transistors $T_1$–$T_4$ are obtained by d.c. coupling from a supply voltage $\frac{1}{2} V_B$ via emitter followers $T_5$ and $T_6$ and first and second voltage dividers $D_1$, $D_2$, $R_1$–$R_3$ and $D_3$, $D_4$, $R_4$–$R_6$. In this situation the collectors of the two emitter followers $T_5$ and $T_6$ are connected to a supply voltage $V_B$. The first voltage divider $D_1$, $D_2$, $R_1$–$R_3$ comprises, arranged between the emitter output of the emitter follower $T_5$ and ground, a series arrangement of, in succession, a diode $D_1$, three resistors $R_1$–$R_3$ and a diode $D_2$, which has a first output $O_1$ located at the junction between the resistors $R_1$ and $R_2$ and connected to the base of the second transistor $T_2$ and a second output $O_2$ located at the junction between the resistors $R_2$ and $R_3$ and connected to the base of the third transistor $T_3$. The second voltage divider $D_3$, $D_4$, $R_4$–$R_6$ comprises, arranged between the emitter output of the emitter follower $T_6$ and ground, a series arrangement of, in succession, a diode $D_3$, a resistor $R_4$, a diode $D_4$ and two resistors $R_5$ and $R_6$, which has a first output $O_3$ located at the junction between the resistor $R_4$ and the diode $D_4$ and connected to the base of the first transistor $T_1$ and a second output $O_4$ at the junction between the resistors $R_5$ and $R_6$ and connected to the base of the fourth transistor $T_4$.

The resistors $R_1$ and $R_4$; $R_2$ and $R_5$; $R_3$ and $R_6$ have mutually identical values, as have also the diodes $D_1$–$D_4$, so that the base biasing voltages of the first and second transistors $T_1$ and $T_2$ are mutually the same, while the base biasing voltage of the third transistor $T_3$ is located one diode voltage step higher than the base biasing voltage of the fourth transistor $T_4$. As a result thereof, in the quiescent state, the third transistor $T_3$ is in a conducting state and the fourth transistor $T_4$ is non-conductive, while the first and second transistors $T_1$ and $T_2$ are mutually in balance. The collectors of the second and fourth transistors $T_2$ and $T_4$ are connected to the supply voltage $V_B$ and therewith connected to earth for RF, so that these transistors are arranged in a grounded-collector connection. The base of the emitter follower $T_6$ is connected to the supply voltage $\frac{1}{2} V_B$ and therewith connected to earth for RF, so that the first transistor $T_1$ is arranged in a grounded-base connection. The collector of the first transistor $T_1$ is connected via a parallel LC-resonant circuit to the supply voltage $\frac{1}{2} V_B$ and constitutes an output $V_{OSC}$ of the oscillator circuit. This collector is connected to the base of the emitter follower $T_5$, as a result of which the voltage across the resonant circuit LC or so-called circuit voltage is positively fed back to the base of the second transistor $T_2$ via this emitter follower $T_5$ and the first voltage divider $D_1$, $D_2$, $R_1$–$R_3$. The second transistor $T_2$ forms together with the first transistor $T_1$ a switching differential amplifier $T_1$, $T_2$ whose output voltage at the collector of $T_1$ is in phase with the input voltage at the base of $T_2$. This output voltage is at its maximum at the resonant frequency of the LC-resonant circuit, so that in a manner which is known per se at an adequate gain of the differential amplifier $T_1$, $T_2$, that is to say at a sufficiently large collector current of $T_3$ a loop gain equal to unity for said resonant frequency is reached and a spontaneous oscillator is effected from a quiescent or initial condition.

The amplitude of the circuit voltage, i.e. the oscillator amplitude depends on the quality factor of the LC-resonant circuit and the magnitude of the collector current of $T_1$ applied to this circuit. An instantaneous stabilization of the circuit voltage is obtained by modulating the collector current in anti-phase by the circuit voltage, that is to say by reducing the collector current instantaneously for an increasing circuit voltage and vice versa. By increasing the circuit voltage-dependent collector current variation the stabilization can be improved.

In the embodiment shown such a modulation of the collector current of $T_1$ is obtained because that portion of the circuit voltage being applied to the base of $T_3$ is in-phase with the circuit voltage portion applied to the base of $T_2$. As, in addition, the transistors $T_1$ and $T_2$ switch alternately and in mutual phase opposition from the conductive to the non-conductive state, the collector current of the first transistor $T_1$, when conducting, corresponds to the collector current of the third transistor $T_3$.

The third transistor $T_3$ forms, together with the fourth transistor $T_4$ a differential amplifier $T_3$, $T_4$, which in certain circumstances acts as a current limiter and whose output current varies in a highly non-linear way with the input voltage. The base biasing voltage of $T_3$ is one diode voltage step higher than the base biasing voltage of $T_4$, as a result of which on the one hand, as mentioned above, a spontaneous oscillation from the quiescent or initial condition is possible and on the other hand the range in which the collector current of $T_3$ has its maximum variation versus the base voltage and in which circuit voltage amplitude deviations are negatively fed back to the highest degree, has been set advantageously for the chosen use of the oscillator circuit.

Figure 2:
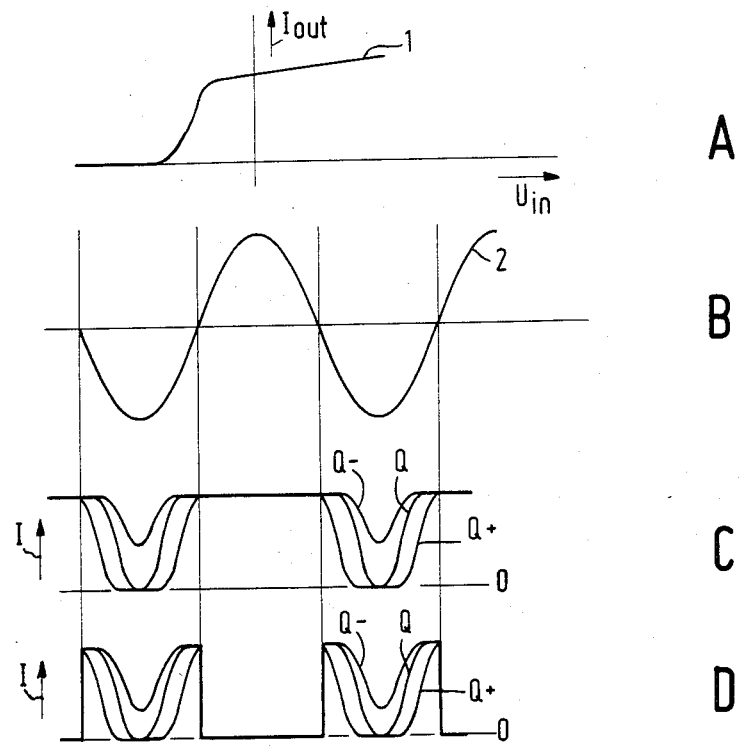
FIGS. 2A–2D show the voltage and time-dependent variations, respectively of the current of the variable current source used in the oscillator circuit of FIG. 1 and the voltage and time-dependent variations of the current applied to the resonant circuit.

Then the collector current of the third transistor $T_3$ varies in dependence on the base input voltage as illustrated in FIG. 2a by means of curve 1. Starting from a certain standardized value Q for the quality factor of the LC-resonant circuit, a sinusoidal circuit voltage having a given desired amplitude whose variation is illustrated in FIG. 2B by means of curve 2, was obtained. The variation of the collector current of the third transistor $T_3$ and the variation of the first transistor $T_1$ are illustrated by means of the respective curves Q in FIGS. 2C and 2D, respectively. A reduction of the circuit voltage, for example due to a variation of the tuning of the LC-resonant circuit because of the use of an LC-resonant circuit having a lower quality factor $Q_-$ or due to ambient factors result in variations of the collector currents of $T_3$ and $T_1$ as illustrated by the respective curves $Q_-$ in FIG. 2B and FIG. 2C, respectively. In response thereto the average collector current of $T_1$ increases instantaneously, so that the circuit voltage also increases instantaneously to the desired standardized value. The opposite situation is obtained when the circuit voltage is increased; the collector currents of $T_3$ and $T_1$, respectively varies as illustrated by curves $Q_+$ in FIGS. 2B and 2C, respectively. Then the average collector current from $T_1$ to the circuit decreases instantaneously, so that also the circuit voltage decreases instantaneously to the desired standardized value. In said practical embodiment the resistors had the following values:

$R_1$ and $R_4$: 200Ω
$R_2$ and $R_5$: 700Ω
$R_3$, $R_6$ and R: 1 KΩ.

The LC-resonant circuit was tunable between 10 and 17 MHz and had a quality factor varying between 30 and 50. Also larger variations of the quality factor, for example between 10 and 130 had hardly any noticeable influence on the oscillator amplitude, thanks to the stabilizing action of the oscillator circuit according to the invention.

Figure 3:
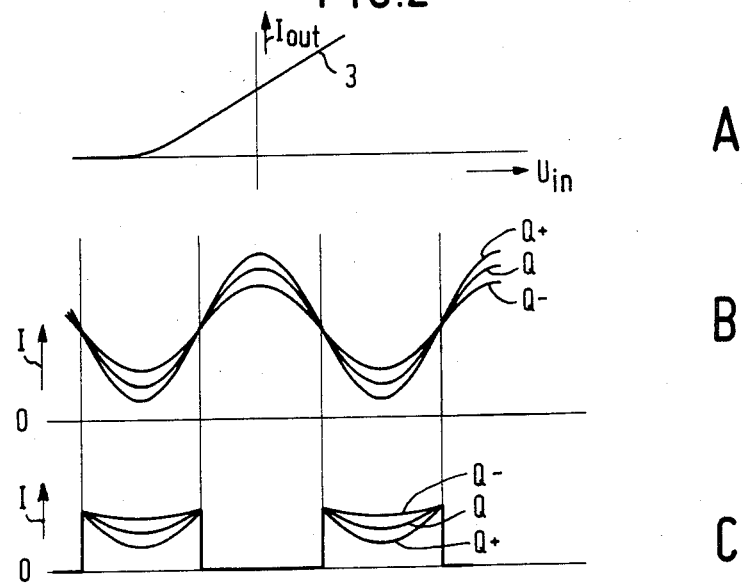
FIGS. 3A–3C show the voltage and time-dependent variations, respectively of the current of a different embodiment of the variable-current source and that of the current applied to the resonant circuit.

It will be obvious that the invention is not limited to the embodiment shown. Thus, it is alternatively possible to omit the fourth transistor $T_4$ and to use only the third transistor $T_3$ with the resistor R as the variable current source for the differential amplifier $T_1$, $T_2$. The collector current of the third transistor $T_3$ then varies linearly versus the base voltage, as illustrated in FIG. 3A by means of curve 3. Starting from a circuit voltage varying as shown in FIG. 2B by means of curve 2, the collector current of $T_3$ and $T_1$, respectively varies as shown in the respective FIGS. 3B and 3C for the desired standardized value of the circuit voltage amplitude in accordance with curve Q for a certain increase in the circuit voltage amplitude in accordance with the curve $Q_+$ and for a certain decrease in accordance with the curve $Q_-$.

It should be noted that for a person skilled in the art it will not be difficult to apply the inventive idea to circuits of different types, which in essence function in the same way as the circuit shown and by using, for example, a non-switching differential amplifier $T_1$, $T_2$. It will further be obvious that the word "transistor" also includes field effect transistors, of which, as is known, the gate, source and drain electrodes, respectively correspond to the base, collector and emitter electrodes of bipolar transistors, used in this description.

What is claimed is:

1. An oscillator circuit comprising first and second transistors whose emitters are intercoupled and jointly connected to a variable current source, the first transistor being connected in a grounded-base connection, also comprising a parallel resonant circuit coupled to the collector of the first transistor, this collector being coupled to the base of the second transistor for a regenerative feedback of the circuit voltage, characterized in that said collector is also coupled to a control unit of the variable current source for an instantaneous variation of the current of the variable current source in dependence on the circuit voltage; and wherein said variable current source comprises a third transistor whose collector is connected to the intercoupled emitters of the two first and second transistors and that the collector of the first transistor is coupled via an emitter follower to a first voltage divider a first output of which is connected to the base of the second transistor and a second output to the base of the third transistor.

2. An oscillator circuit as claimed in claim 1, characterized in that the current source further comprises a fourth transistor whose base is connected to a fixed base biasing voltage and whose emitter is coupled to the emitter of the third transistor, both emitters being jointly connected to a constant current source.

3. An oscillator circuit as claimed in claim 2, characterized in that a second voltage divider is arranged between a supply voltage and ground a first output thereof being coupled to the base of the first transistor and a second output to the base of the fourth transistor.

* * * * *